(12) United States Patent
Yoshikawa et al.

(10) Patent No.: US 9,530,920 B2
(45) Date of Patent: Dec. 27, 2016

(54) PHOTOELECTRIC CONVERSION DEVICE

(75) Inventors: Akihiko Yoshikawa, Chiba (JP);
Yoshihiro Ishitani, Chiba (JP);
Kazuhide Kusakabe, Chiba (JP)

(73) Assignee: National University Corporation Chiba University, Chiba (JP)

( * ) Notice: Subject to any disclaimer, the term of this patent is extended or adjusted under 35 U.S.C. 154(b) by 622 days.

(21) Appl. No.: 13/389,191

(22) PCT Filed: Aug. 5, 2010

(86) PCT No.: PCT/JP2010/063336
§ 371 (c)(1),
(2), (4) Date: Mar. 7, 2012

(87) PCT Pub. No.: WO2011/016537
PCT Pub. Date: Feb. 10, 2011

(65) Prior Publication Data
US 2012/0186640 A1    Jul. 26, 2012

(30) Foreign Application Priority Data

Aug. 6, 2009   (JP) ................................ 2009-183263

(51) Int. Cl.
*H01L 31/0693*    (2012.01)
*H01L 31/0687*    (2012.01)
(Continued)

(52) U.S. Cl.
CPC ... *H01L 31/0693* (2013.01); *H01L 31/035209* (2013.01); *H01L 31/035236* (2013.01);
(Continued)

(58) Field of Classification Search
CPC .................................................. H01L 31/0684
See application file for complete search history.

(56) References Cited

U.S. PATENT DOCUMENTS 4,688,068 A * 8/1987 Chaffin et al. ................ 136/249
7,217,882 B2   5/2007 Walukiewicz et al.
(Continued)

FOREIGN PATENT DOCUMENTS

JP   2001-168390 A   6/2001
JP   2002-141531 A   5/2002
JP   2007-335854 A   12/2007

OTHER PUBLICATIONS

A. Yoshikawa, et al., "Growth of InN quantum dots on N-polarity GaN by molecular-beam epitaxy", Applied Physics Letters 86, 153115 (2005).*

(Continued)

*Primary Examiner* — Eric R Smith
(74) *Attorney, Agent, or Firm* — Konomi Takeshita

(57) ABSTRACT

A photoelectric conversion device which is a semiconductor device comprising a first conductive layer having a first conductivity type; a second conductive layer formed on the first conductive layer and having a second conductivity type; and a photosensitizing layer formed between the first conductive layer and the second conductive layer, wherein charge carriers generated by photoelectric conversion in the photosensitizing layer are freely movable to at least one of the first conductive layer and the second conductive layer.

15 Claims, 12 Drawing Sheets

(51) Int. Cl.
*H01L 31/0735* (2012.01)
*H01L 31/0352* (2006.01)
*H01L 31/043* (2014.01)
*H01L 31/18* (2006.01)

(52) U.S. Cl.
CPC ........ *H01L 31/043* (2014.12); *H01L 31/0687* (2013.01); *H01L 31/0735* (2013.01); *H01L 31/1848* (2013.01); *H01L 31/1856* (2013.01); *Y02E 10/544* (2013.01); *Y02P 70/521* (2015.11)

(56) References Cited

U.S. PATENT DOCUMENTS

| | | | |
|---|---|---|---|
| 2002/0101895 A1 | 8/2002 | Augusto | |
| 2004/0118451 A1 | 6/2004 | Walukiewicz et al. | |
| 2006/0244003 A1* | 11/2006 | Ueda et al. | 257/103 |
| 2007/0151592 A1* | 7/2007 | Forrest et al. | 136/243 |
| 2008/0128745 A1* | 6/2008 | Mastro et al. | 257/184 |
| 2009/0321781 A1* | 12/2009 | Broadley et al. | 257/103 |
| 2010/0006143 A1* | 1/2010 | Welser | 136/255 |

OTHER PUBLICATIONS

W-H. Chang, et al., "Effects of growth temperature on InN/GaN nanodots grown by metal organic chemical vapor deposition", Journal of Applied Physics 103, 104306 (2008).*

A. Yoshikawa, et al., "Fabrication and characterization of novel multilayer InN quantum wells in a GaN matrix", Journal of Vacuum Science and Technology B 26, p. 1551-1559 (2008).*

A. Yuki, et al "1-2 ML thick InN-based quantum wells with InGaN barriers for blue-green light emitters", Physica Status Solidi C 6, p. S417-S420 (2009).*

Akihiko Yoshikawa, Song-Bek Che and Xinqiang Wang, Epitaxy control of InN-based III-nitrides towards development of novel nanostructure photonic devices, Graduate Course of Electrical and Electronics Engineering Chiba University, Oyo Buturi, vol. 76, No. 05, p. 0482-0488 (2007) Chiba City Japan.

* cited by examiner

PHOTOELECTRIC CONVERSION DEVICE

CROSS REFERENCE TO RELATED APPLICATIONS

This application claims priority under 35 U.S.C. 119 and 35 U.S.C. 365 based upon Japanese Patent Application No. 2009-183263, filed on Aug. 6, 2009. The entire disclosure of the aforesaid application is incorporated herein by reference.

FIELD OF THE INVENTION

The present invention relates to a photoelectric conversion device adapted to a wide range of wavelengths from ultraviolet to infrared wavelengths, and particularly, to a solar cell having a photosensitizing function and a method for manufacturing the solar cell.

BACKGROUND OF THE INVENTION

In recent years, the importance of approach to energy issues has grown out of concern over global warming due to greenhouse gases. It is a pressing need, in particular, to break away from dependence on fossil fuels. Under such circumstances, electric generation by the photoelectric conversion of solar light energy, i.e., a solar cell is a key to solving the above-described problem.

Currently, most solar cells use silicon (Si) as the raw material thereof. On the other hand, a solar cell using gallium arsenide (GaAs) which is a compound semiconductor has been put into practical use in applications, such as mounting on an artificial satellite, requiring high photoelectric conversion efficiency, for reasons of matching with a solar light spectrum.

Next, the configuration of such a solar cell will be described with reference to FIG. 12. FIG. 12 is a block diagram illustrating, by way of example, the configuration of a conventional pn junction-type semiconductor solar cell 100. The solar cell 100 has a known configuration comprising an n-type semiconductor layer 102 and a p-type semiconductor layer 104 formed on the n-type semiconductor layer 102. These layers are formed as a unit cell by using known semiconductor manufacturing techniques and the like. However, solar cells can use only the solar light having a wavelength range corresponding to a forbidden band width (bandgap energy) that the material of the solar cells has. Accordingly, the solar cell composed of the unit cell is limited in the photoelectric conversion efficiency thereof.

Hence, there has been proposed a structure of a tandem solar cell intended to widen the available range of solar light spectra and improve photoelectric conversion efficiency. This tandem structure is composed of a plurality of unit cell structures similar or identical to the solar cell 100 illustrated in FIG. 12, where the respective unit cells have different forbidden band widths and are stacked along an entering direction of light from a light-receiving plane, in the order of the widest to narrowest forbidden band widths. For example, the tandem solar cell described in U.S. Pat. No. 7,217,882 (hereinafter referred to as Patent Literature 1) has a forbidden band width corresponding to 3.4 eV to 0.7 eV and is, therefore, compatible with a wide wavelength range of solar light spectra.

As another technology, there has been proposed a solar cell comprising a quantum well structure. For example, the solar cell described in Japanese Unexamined Patent Application No. JP-A-2002-141531 (hereinafter referred to as Patent Literature 2) has a configuration including a plurality of convex portions on a quantum well surface.

The current conservation condition that respective cells constituting a tandem structure generate the same excited current is required to be satisfied, in order to realize high photoelectric conversion efficiency in a tandem solar cell. In other words, an absorption edge wavelength, i.e., a forbidden band width in each cell, has to be precisely controlled, in order to equalize photoexcited currents generated in the respective cells.

The material composing the tandem solar cell described in Patent Literature 1 is a mixed crystal of indium gallium nitride (InGaN). InGaN is strong in thermodynamical immiscibility, and therefore, an inhomogeneous microscale mixed crystal composition distribution takes place. This means that the forbidden band width of InGaN is not uniquely determined. Accordingly, the inventors have clarified that it is difficult to precisely control the absorption edge wavelength of each cell when a tandem solar cell is formed of InGaN.

On the other hand, the material composing the solar cell described in Patent Literature 2 is a GaAs-based material. With this material system, it is possible to use only part of a solar spectrum. Thus, photoelectric conversion efficiency as high as that of a tandem solar cell cannot be expected from the solar cell.

In addition, the solar cell described in this Patent Literature 2 has a configuration including a plurality of convex portions on a surface of a quantum well layer. This means that an absorption edge wavelength is varied by the convex portions of the quantum well layer. Accordingly, the inventors have clarified that it is difficult to precisely control the absorption edge wavelength of the solar cell described in this Patent Literature 2, and therefore, the solar cell is unsuitable for forming a tandem structure.

In addition, if the potential barrier of the quantum well structure is high and carriers localize deep in the well layer, it is no longer possible to take out the carriers from the quantum well layer as a current. Also from this point of view, it is a critical issue to precisely control the forbidden band width of a material composing the solar cell.

The present invention has been accomplished in view of such circumstances as described above. Accordingly, an object of the present invention is to provide a solar cell which facilitates precise control of the absorption edge wavelength of each cell in a tandem solar cell and has high photoelectric conversion efficiency, and a method for manufacturing the solar cell.

SUMMARY OF THE INVENTION

A photoelectric conversion device according to a first aspect of the present invention comprises: a first conductive layer having a first conductivity type; a second conductive layer having a second conductivity type formed on the first conductive layer; and a photosensitizing layer formed between the first conductive layer and the second conductive layer, wherein charge carriers generated by photoelectric conversion in the photosensitizing layer are freely movable to at least one of the first conductive layer and the second conductive layer.

The photoelectric conversion device according to the first aspect of the present invention may be such that the first conductive layer has first bandgap energy, the second conductive layer has second bandgap energy, the photosensitizing layer has third bandgap energy, and the third bandgap energy is lower than the first and second bandgap energy.

The photoelectric conversion device according to the first aspect of the present invention may further comprise a fourth conductive layer formed between the first conductive layer and the photosensitizing layer and having a fourth conductivity type, wherein the fourth conductive layer has fourth bandgap energy and electrically connects the first conductive layer and the photosensitizing layer to each other.

The photoelectric conversion device according to the first aspect of the present invention may further comprise a fifth conductive layer formed between the second conductive layer and the photosensitizing layer, wherein the fifth conductive layer has fifth bandgap energy and the fifth bandgap energy is not higher than the second bandgap energy and not lower than the third bandgap energy.

The photoelectric conversion device according to the first aspect of the present invention may further comprise at least one of a sixth conductive layer formed underneath the first conductive layer and having a sixth conductivity type and a seventh conductive layer formed on the second conductive layer and having a seventh conductivity type, wherein the first conductive layer and the sixth conductive layer are electrically connected to each other, and the second conductive layer and the seventh conductive layer are electrically connected to each other.

A solar cell according to a second aspect of the present invention comprises: a first layer having a first conductivity type; a second $In_xGa_yAl_{1-x-y}N$ layer formed on the first $In_xGa_yAl_{1-x-y}N$ layer and having a second conductivity type; and an InN photosensitizing layer formed between the first $In_xGa_yAl_{1-x-y}N$ layer and the second $In_xGa_yAl_{1-x-y}N$ layer, wherein the ranges of x and y are defined as $0 \leq x+y \leq 1$, the InN photosensitizing layer has a layer thickness equal to or less than a bimolecular layer thickness, and photoexcited carriers in the InN photosensitizing layer are freely movable to at least one of the first $In_xGa_yAl_{1-x-y}N$ layer and the second $In_xGa_yAl_{1-x-y}N$ layer by thermal excitation or by an intraband light absorption process.

The solar cell according to the second aspect of the present invention may be such that the first $In_xGa_yAl_{1-x-y}N$ layer has first bandgap energy, the second $In_xGa_yAl_{1-x-y}N$ layer has second bandgap energy, and the effective bandgap energy of the InN photosensitizing layer is lower than the first and second bandgap energy.

The solar cell according to the second aspect of the present invention may further comprise a fourth $In_xGa_yAl_{1-x-y}N$ layer formed between the first $In_xGa_yAl_{1-x-y}N$ layer and the InN photosensitizing layer and having a fourth conductivity type, wherein the fourth $In_xGa_yAl_{1-x-y}N$ layer has fourth bandgap energy and a film thickness with which the first $In_xGa_yAl_{1-x-y}N$ layer and the InN photosensitizing layer are freely and electrically connectable to each other.

The solar cell according to the second aspect of the present invention may further comprise a fifth $In_xGa_yAl_{1-x-y}N$ layer formed between the second $In_xGa_yAl_{1-x-y}N$ layer and the InN photosensitizing layer, wherein the fifth $In_xGa_yAl_{1-x-y}N$ layer has fifth bandgap energy, and the fifth bandgap energy is not higher than the second bandgap energy and not lower than the effective bandgap energy of the InN photosensitizing layer.

The solar cell according to the second aspect of the present invention may further constitute at least one of a first cell and a second cell included in a tandem solar cell.

The solar cell according to the second aspect of the present invention may be such that the tandem solar cell further includes a growth substrate, and comprises the first cell on one surface of the growth substrate and the second cell on the other surface of the growth substrate.

The solar cell according to the second aspect of the present invention may be such that the growth substrate is made of one of a nitride semiconductor, zinc oxide, silicon, and silicon carbide.

The solar cell according to the second aspect of the present invention may further comprise a first electrode electrically connected to the first cell, a second electrode electrically connected to the second cell, and a third electrode electrically connected to the growth substrate.

A method, according to a third aspect of the present invention, for manufacturing a solar cell provided with a first $In_xGa_yAl_{1-x-y}N$ layer having a first conductivity type, a second $In_xGa_yAl_{1-x-y}N$ layer formed on the first $In_xGa_yAl_{1-x-y}N$ layer and having a second conductivity type, and an InN photosensitizing layer formed between the first $In_xGa_yAl_{1-x-y}N$ layer and the second $In_xGa_yAl_{1-x-y}N$ layer, wherein the ranges of x and y are defined as $0 \leq x+y \leq 1$, and the InN photosensitizing layer has a layer thickness equal to or less than a bimolecular layer thickness, comprises: a first step of forming the first $In_xGa_yAl_{1-x-y}N$ layer; a second step of forming the second $In_xGa_yAl_{1-x-y}N$ layer having the second conductivity type; and a third step of forming the InN photosensitizing layer.

The method, according to a third aspect of the present invention, for manufacturing a solar cell may be such that the third step includes a step of supplying InN whose amount is greater than or equal to a bimolecular layer-equivalent amount thereof.

The method, according to the third aspect of the present invention, for manufacturing a solar cell may be such that the third step includes a step of not supplying a raw material of In.

The method, according to the third aspect of the present invention, for manufacturing a solar cell may be such that the third step includes growth interruption.

The method, according to the third aspect of the present invention, for manufacturing a solar cell may be such that in the third step, growth temperature is higher than or equal to 600° C.

The method, according to the third aspect of the present invention, for manufacturing a solar cell may be such that the growth temperature is 650° C. or higher but not higher than 720° C.

The method, according to the third aspect of the present invention, for manufacturing a solar cell may be such that the method includes a step of observing the physical or chemical condition of a growth surface.

As has been described heretofore, according to the present invention, precise control of the absorption edge wavelength is made easy without lowering a photoexcited voltage. Thus, it is possible to enhance a photoexcited current. That is, it is possible to provide a solar cell having high photoelectric conversion efficiency due to a photosensitizing effect, and a method for manufacturing the solar cell.

Other features and advantages of the present invention will become apparent from the following detailed description, taken in conjunction with the accompanying drawings which illustrate, by way of example, the principles of the invention.

DETAILED DESCRIPTION OF THE INVENTION

Hereinafter, embodiments of the present invention will be described with reference to the accompanying drawings. It should be noted, however, that the following descriptions of the embodiments are merely exemplary in nature and are in no way intended to limit the scope of the invention.

First Embodiment

Figure 1:
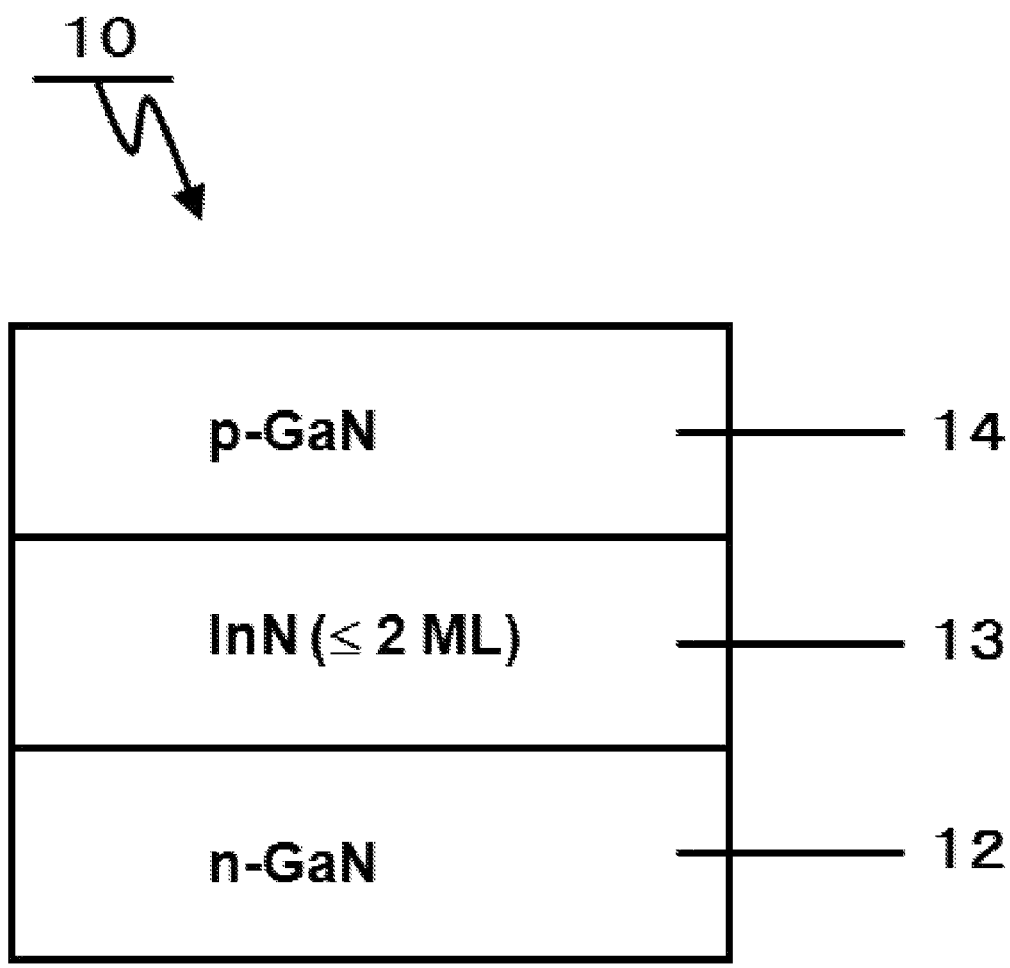
FIG. 1 is a block diagram illustrating a configuration example of a solar cell according to a first embodiment of the present invention.

FIG. 1 is a block diagram illustrating a configuration example of a solar cell 10 according to the present embodiment. In FIG. 1, the solar cell 10 comprises: an n-type gallium nitride (hereinafter referred to as n-GaN) layer 12; a p-type gallium nitride (hereinafter referred to as p-GaN) layer 14 formed on the n-GaN layer 12; an indium nitride (InN) photosensitizing layer 13 formed between the n-GaN layer 12 and the p-GaN layer 14; an unillustrated n-type electrode electrically connected to the n-GaN layer 12; and an unillustrated p-type electrode electrically connected to the p-GaN layer 14.

The n-GaN layer 12 is used to separate electron-hole pairs generated by photoelectric conversion and transport electrons to the n-type electrode. The p-GaN layer 14 is used to separate electron-hole pairs generated by photoelectric conversion and transport holes to the p-type electrode. Accordingly, the resistivity and layer thickness of each of the n-GaN layer 12 and p-GaN layer 14 is suitably adjusted, in order to efficiently perform carrier transport.

The InN photosensitizing layer 13 is used to produce a sensitizing effect by which not only light corresponding to the forbidden band width (bandgap energy) of GaN forming a pn junction but also light having longer wavelengths are made available for photoelectric conversion. It is, therefore, possible to improve spectral sensitivity characteristics and obtain a solar cell having high conversion efficiency, without lowering a photoexcited voltage.

The n-type electrode and the p-type electrode are used to take out a generated photoelectromotive force.

Next, a description will be given of the physical properties of InN and the sensitizing effect of the InN photosensitizing layer 13 which are the most important points in the present invention.

As with the InN photosensitizing layer 13 of the present embodiment illustrated in FIG. 1, InN is generally formed on GaN by known semiconductor manufacturing techniques and the like. InN and GaN have therebetween a degree of lattice mismatch of approximately 11% in the case of, for example, c-face growth. Consequently, a high-density lattice defect is introduced during crystal growth. This lattice defect significantly deteriorates photoelectric conversion efficiency. The inventors have found that the upper limit of film thickness, i.e., a critical film thickness at which InN retains elastic deformation without introducing any lattice defects and is capable of coherent growth with respect to GaN is a bimolecular layer thickness (2 ML).

In addition, crystal growth extremely superior in structural integrity is realized in this ultrathin InN film having a layer thickness equal to or less than a bimolecular layer thickness due to immiscibility with GaN. Consequently, a self-ordered and self-stopping process is feasible and a steep InN/GaN boundary face on the order of an atomic layer is formed. Yet additionally, the ultrathin InN film is substantially free from composition inhomogeneity. Consequently, the absorption edge wavelength of the ultrathin InN film is determined easily and precisely.

The inventors have also found that whereas the growth temperature of InN has been limited to approximately 600° C. or lower in the case of, for example, a molecular beam epitaxy (MBE) method, the above-described ultrathin InN film is capable of growth at a temperature higher than or equal to 600° C. This high-temperature growth dramatically improves the crystallinity of the ultrathin InN film. As described above, unlike regular InN, the ultrathin InN film exhibits the physical properties of its own and, consequently, realizes high photoelectric conversion efficiency (internal quantum efficiency).

Figure 2:
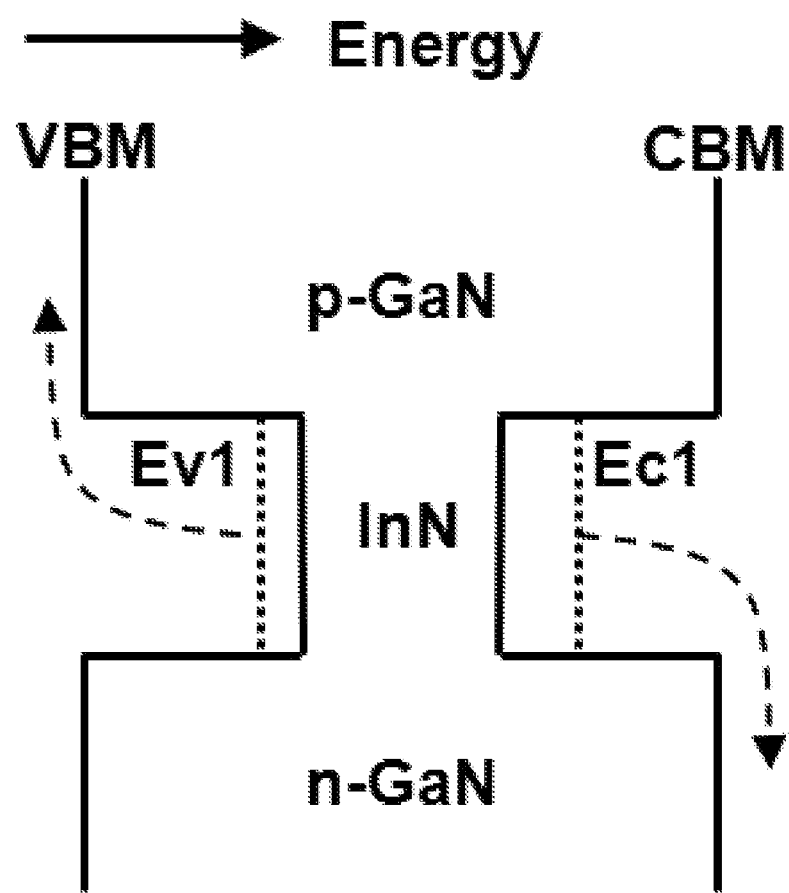
FIG. 2 is a conceptual drawing illustrating band lineups of GaN and InN.

FIG. 2 is a conceptual drawing illustrating band lineups of GaN and InN. In FIG. 2, the InN photosensitizing layer 13 is sandwiched by the n-GaN layer 12 and the p-GaN layer 14, as in FIG. 1. CBM and VBM denote a conduction band bottom and a valence band top, respectively, and energy heightens in a direction from left to right in the arrangement in the figure.

The bandgap energy levels of InN and GaN are approximately 0.65 eV and 3.4 eV, respectively, the conduction band offsets thereof are approximately 2 eV, and the valence band offsets thereof are approximately 0.75 eV. These large potential barriers almost completely confine photoexcited carriers within the InN layer. It is, therefore, not possible to take out the carriers as a current if nothing is done.

On the other hand, if the InN layer is thinned to a thickness on the order of nanometers, the quantum levels Ec1 and Ev1 of electrons and holes are formed in energy positions shown by dotted lines in the figure. Due to this quantum size effect, the effective bandgap energy (difference between Ec1 and Ev1) of InN shifts from 0.65 eV. The inventors have found that the effective bandgap energy is always lower by 500 meV than the bandgap energy of GaN in the case of, for example, a bimolecular InN layer, and the effective bandgap energy is always lower by 200 meV than the bandgap energy of GaN in the case of a monomolecular InN layer.

Since the ultrathin InN film is available in a self-ordered manner, a difference between the effective bandgap energy and the bandgap energy of GaN is automatically controlled to approximately 500 meV for a bimolecular layer and to approximately 200 meV for a monomolecular layer, respectively. These values are significantly low, compared with those of the above-described regular InN and GaN. That is, by forming the InN photosensitizing layer 13 to a layer thickness equal to or less than a bimolecular layer thickness, carriers are made fully and freely movable from the InN photosensitizing layer 13 to the n-GaN layer 12 and the p-GaN layer 14 even by a thermal excitation process at room temperature.

In addition, an intraband transition process of absorbing light having bandgap energy lower than the 0.65 eV bandgap energy of InN is assisted in carrier transfer from the InN photosensitizing layer 13 to the n-GaN layer 12 and the p-GaN layer 14.

As a result, the ultrathin InN film can provide a photosensitizing effect.

According to the discussions made hereinbefore, the solar cell 10 according to the present embodiment can make not only light corresponding to the forbidden band width (bandgap energy) of GaN forming a pn junction but also light corresponding to the effective bandgap energy of the InN photosensitizing layer 13 available for photoelectric conversion, without lowering a photoexcited voltage. Consequently, it is possible to obtain a solar cell having high power due to the photosensitizing effect of longer-wavelength components.

Note that in the present embodiment, a description has been given of a configuration in which a pn junction is formed of GaN. The present embodiment is not limited to this configuration, however. For example, a configuration in which a pn junction is formed of an indium gallium aluminum nitride (hereinafter represented as $In_xGa_yAl_{1-x-y}N$, where the ranges of x and y are defined as $0 \leq x+y \leq 1$) is also possible. According to this configuration, the forbidden band width of $In_xGa_yAl_{1-x-y}N$ can be optionally varied by varying the mixed crystal ratios x and y. Since the effective bandgap energy of an ultrathin InN film having a layer thickness equal to or less than a bimolecular layer thickness is also approximately several 100 meV lower than the bandgap energy of $In_xGa_yAl_{1-x-y}N$, the absorption edge wavelength of a solar cell is easily and precisely controlled, while allowing the ultrathin InN film to have a photosensitizing effect.

In addition, in the present embodiment, a description has been be given of a configuration in which the InN photosensitizing layer 13 is formed of a single layer, as illustrated in FIGS. 1 and 2. Alternatively, a configuration is possible in which, for example, a plurality of InN photosensitizing layers 13 is inserted to form a multilayer structure. According to this configuration, the amount of light absorbed increases with an increase in the number of the plurality of inserted InN photosensitizing layers 13. Thus, it is possible to further enhance the photosensitizing effect. In this case, the multilayer structure may be composed of InN photosensitizing layers 13 running off from the depletion region of a pn-junction boundary face.

In addition, a configuration is possible in which the InN photosensitizing layer 13 is sandwiched or capped by undoped GaN (hereinafter referred to as i-GaN) layers, whether the InN layer is a monolayer or a multilayer. With this configuration, it is possible to suitably control the depletion region of the pn-junction boundary face.

[Method for Manufacturing Solar Cell of First Embodiment]

Figure 3:
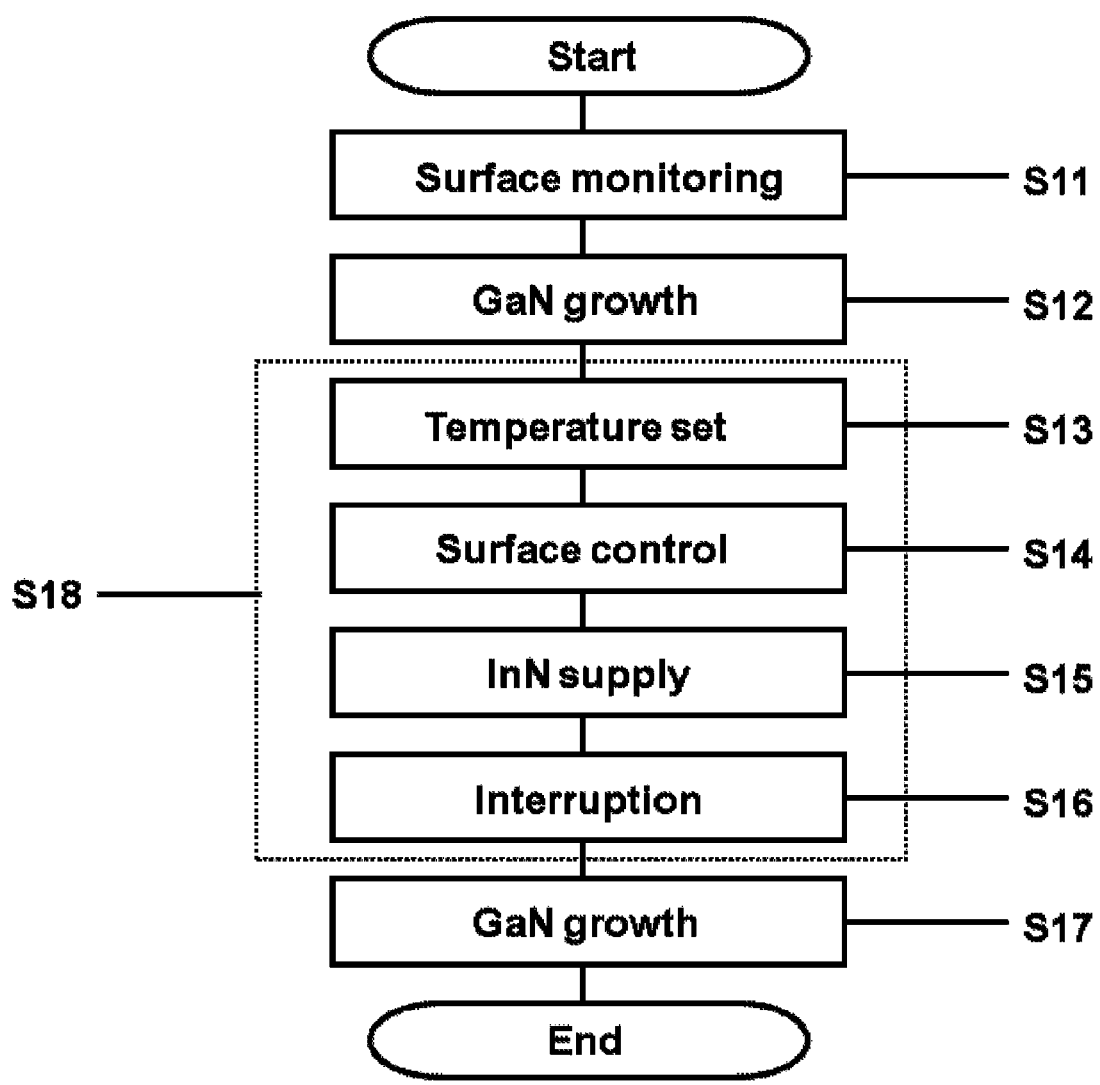
FIG. 3 is a flowchart illustrating a method for manufacturing the solar cell according to the first embodiment.

A method for manufacturing the solar cell 10 of the first embodiment will be described with reference to FIG. 3. Note that a description will be given here by citing a molecular beam epitaxy (MBE) method as an example. Crystal growth techniques are not limited to this method only, however, but other known semiconductor manufacturing techniques will also apply analogously. FIG. 3 is a flowchart illustrating the method for manufacturing the solar cell 10 according to the first embodiment. The figure illustrates, in particular, a growth method of the InN photosensitizing layer 13 and processes before and after the layer growth which are the most important features of the present invention. Other unillustrated pre-processes, such as substrate treatment and foundation layer formation, and unillustrated post-processes, such as surface layer formation, electrode formation and microfabrication, are carried out using known semiconductor manufacturing techniques.

First, a surface condition observation of a sample having undergone the above-described pre-processes is initiated (step S11). This surface condition observation is conducted by means of, for example, reflected high energy electron diffraction (RHEED) or spectral ellipsometry (SE). In this way, the physical or chemical condition of the growth surface of the sample during the growth of each layer and before and after the layer growth is observed in real time. This is because the growth of an ultrathin InN film is based on a self-ordered and self-stopping process taking advantage of the immiscibility of InN, and therefore, control of surface-adsorbed atoms, i.e., stoichiometric surface control, for example, is required.

Next, GaN growth is performed (step S12). This GaN may be either the n-GaN layer 12 or the p-GaN layer 14 constituting the solar cell 10 of the present embodiment, or may be the above-described i-GaN layer. Thereafter, a process of forming the InN photosensitizing layer 13 is carried out (step S18).

Step S18 comprises growth temperature setting (step S13), a growth surface control process (step S14), supply of raw materials of indium (In) and nitrogen (N) (step S15), and growth interruption (step S16).

In an MBE method, GaN growth shown in step S12 is generally performed under slightly gallium (Ga)-rich stoichiometric surface conditions. In order to ensure immiscibility between InN and GaN, however, it is not preferable that adsorbed Ga is present on a growth surface immediately before the growth of the ultrathin InN film. Hence, in step S14, only the raw material of N is supplied, without supplying the raw material of In, so that surface-adsorbed Ga is crystallized into GaN or dried up. In step S15, a raw material corresponding in amount to a layer thickness equal to or larger than a bimolecular layer thickness is excessively supplied, though the raw materials of both In and N are supplied, in order to form an ultrathin InN film having a layer thickness equal to or less than a bimolecular layer thickness. The physical/chemical conditions of the growth surface in step S18 have been comprehended by the surface condition observation initiated in step S11.

The layer thickness control of the InN photosensitizing layer 13 takes advantage of a desorption process of excessively-supplied InN and is, therefore, performed using the growth temperature set in step S13 and a time of growth interruption introduced as step S16. Typically, InN growth is performed at a growth temperature of approximately 600° C. or lower if the InN growth is performed by a MBE method.

However, the inventors have found that an ultrathin InN film having a layer thickness equal to or less than a bimolecular layer thickness can be grown even at a temperature higher than or equal to this critical temperature of approximately 600° C. Specifically, a bimolecular InN layer is formed in a self-selective manner within the growth temperature range of 600° C. to 650° C. If the growth temperature is approximately 650° C., a monomolecular layer of InN is formed in a self-selective manner. If the growth temperature is raised further to within the range of approximately 650° C. to approximately 720° C., a fractional superlattice of InN smaller in thickness than a monomolecular layer is formed. This fractional superlattice of InN means that surface coverage is 1 or less. For example, a 0.5 molecular layer corresponds to an island structure having a monomolecular layer thickness and a surface coverage of 50%, i.e., a quantum disc structure. In addition, in the above-described growth interruption, a time scale of approximately 0 to 1 minute is controlled in units of seconds. This is a time scale that can be fully controlled in a standard MBE apparatus.

After the process of forming the InN photosensitizing layer 13 shown in step S18, GaN growth is performed (step S17). As with step S12, this GaN may be either the n-GaN layer 12 or the p-GaN layer 14 composing the solar cell 10 of the present embodiment, or may be the above-described i-GaN layer.

If the InN photosensitizing layer 13 is formed into a multilayer structure, step S18 is repeated a desired number of times, following step S17.

By going through the above-described post-processes after the completion of step S17, there is obtained the solar cell 10 of the present embodiment.

The method for manufacturing the solar cell 10 of the present embodiment has been described heretofore by citing the growth of GaN as an example in steps S12 and S17. The method is not limited to this growth only, however. It is to be understood that the method also includes, for example, the growth of $In_xGa_yAl_{1-x-y}N$ (ranges of x and y are defined as $0 \leq x+y \leq 1$).

Second Embodiment

In the first embodiment, a description has been given of a solar cell having a configuration in which an ultrathin InN film is inserted into a pn junction formed of GaN. By replacing the pn junction of this solar cell with an $In_xGa_yAl_{1-x-y}N$-based pn junction which is a modified example of the pn junction, the forbidden band width of the solar cell can be adapted to the range of 6.2 eV to 0.65 eV, while allowing the ultrathin InN film to provide a sensitizing effect. Consequently, it is possible to configure each cell of a tandem solar cell matching with approximately 87.5% of a spectral domain of total solar light power. In order to configure the tandem solar cell, the above-described modified example of the solar cell is used as a unit cell having a different forbidden band width, and respective unit cells are stacked along an entering direction of light from a light-receiving plane, in the order of widest to narrowest forbidden band widths. In the present embodiment, a description will be given of a solar cell, as a configuration example of the above-described unit cell, in which an ultrathin InN film is inserted into an InGaN-based pn junction, while referring to FIGS. 4 to 6.

Figure 4:
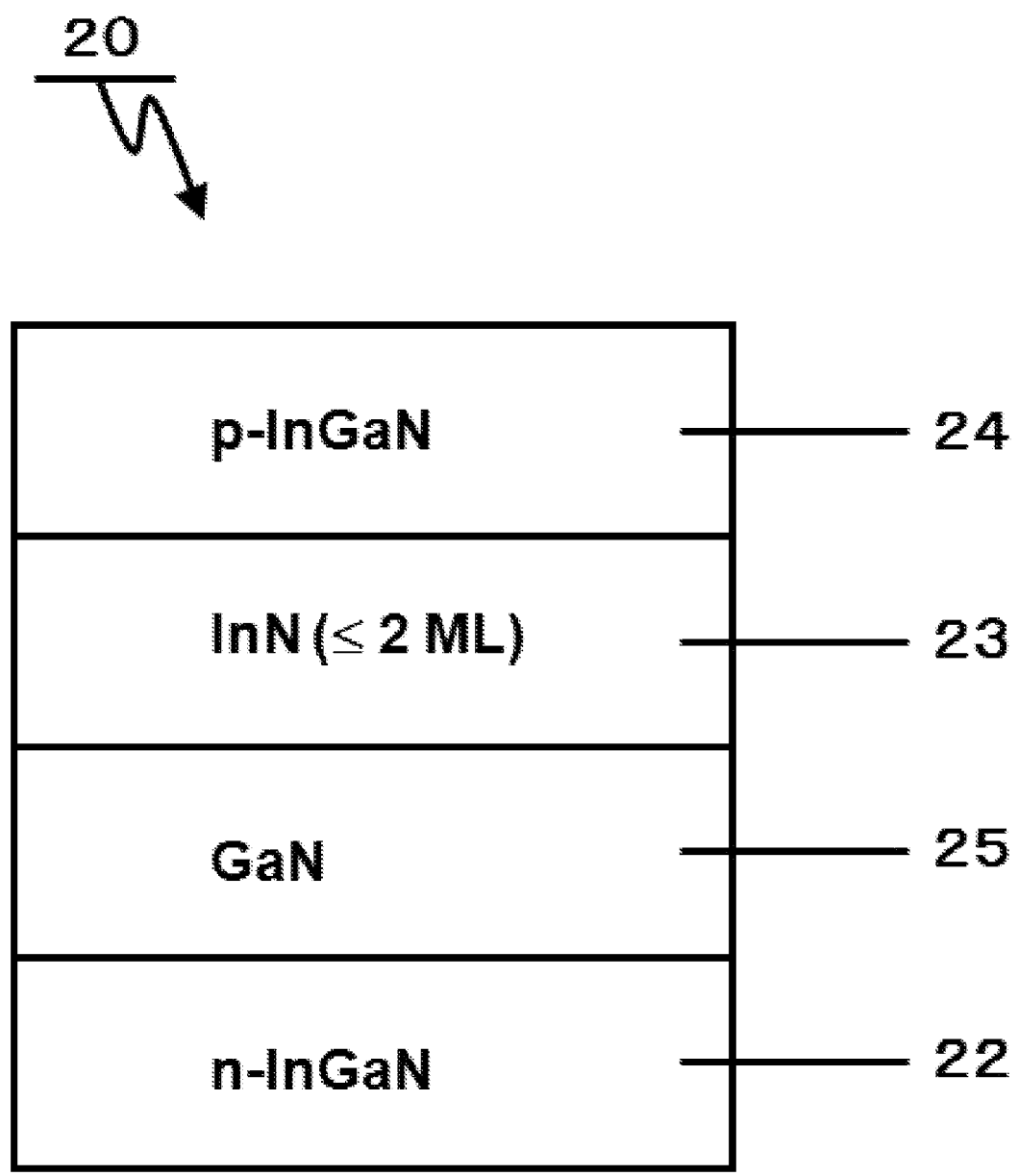
FIG. 4 is a block diagram illustrating a configuration example of a unit cell for constituting a tandem solar cell according to a second embodiment of the present invention.

FIG. 4 is a block diagram illustrating a configuration example of a unit cell 20 constituting the tandem solar cell according to the present embodiment. In FIG. 4, the unit cell 20 comprises: an n-type indium gallium nitride (hereinafter referred to as n-InGaN) layer 22; a gallium nitride (GaN) layer 25 formed on the n-InGaN layer 22; an indium nitride (InN) photosensitizing layer 23 formed on the GaN layer 25; and a p-type indium gallium nitride (hereinafter referred to as p-InGaN) layer 24 formed on the InN photosensitizing layer 23.

The n-InGaN layer 22 is used to separate electron-hole pairs generated by photoelectric conversion and transport electrons. The p-InGaN layer 24 is used to separate electron-hole pairs generated by photoelectric conversion and transport holes. Accordingly, the resistivities and layer thicknesses of the n-InGaN layer 22 and the p-InGaN layer 24 are suitably adjusted to efficiently perform carrier transport. In addition, the mixed crystal composition ratios of the n-InGaN layer 22 and the p-InGaN layer 24, are suitably controlled, so that the forbidden band widths (bandgap energy) of the layers satisfy matching with a solar light spectrum and the current conservation condition that respective cells in a tandem structure generate the same excited current.

The InN photosensitizing layer 23 is used to produce a sensitizing effect by which not only light corresponding to the bandgap energy of InGaN forming a pn junction but also light having longer wavelengths are made available for photoelectric conversion. It is, therefore, possible to improve spectral sensitivity characteristics and obtain a unit cell 20 having high conversion efficiency, without lowering a photoexcited voltage. Note that in the present embodiment, a description will be given of a configuration example in which a pn junction is formed of InGaN. The present embodiment is not limited to this configuration only, however. For example, a configuration in which a pn junction is formed of $In_xGa_yAl_{1-x-y}N$ (ranges of x and y are defined as $0 \leq x+y \leq 1$) is also possible.

Next, a description will be given of the GaN layer 25 constituting the unit cell 20 according to the present embodiment. The formation of the InN photosensitizing layer 23 takes advantage of a self-ordered and self-stopping process based on immiscibility with a foundation GaN layer, as described in the first embodiment. It is conceivable, however, that immiscibility between InN and InGaN does not develop fully if the pn junction is formed of InGaN.

In order to make the unit cell 20 adapted to a tandem structure, the In composition ratios of the n-InGaN layer 22 and the p-InGaN layer 24 need to increased. This corresponds to that the In composition ratio x also needs to be increased even when the pn junction is formed of $In_xGa_yAl_{1-x-y}N$. Accordingly, an attempt has been made to directly form the InN photosensitizing layer 23 on the n-InGaN layer 22. Consequently, the inventors have found that the self-ordered and self-stopping process of the ultrathin InN film does not function sufficiently since the above-described immiscibility is suppressed. To cite a specific example, any ultrathin InN film was not observed to be formed by a self-ordered and self-stopping process on InGaN having an In composition of approximately 20% (corresponding in absorption edge wavelength to approximately 500 nm).

A key point of the present embodiment is to adopt a configuration in which the GaN layer 25 is inserted between the n-InGaN layer 22 and the InN photosensitizing layer 23, in order to take advantage of the immiscibility of InN with the aim of solving the above-described problem. This configuration allows immiscibility to develop between the InN photosensitizing layer 23 and the GaN layer 25. Thus, it is possible to form an ultrathin InN film based on a self-ordered and self-stopping process.

Figure 5:
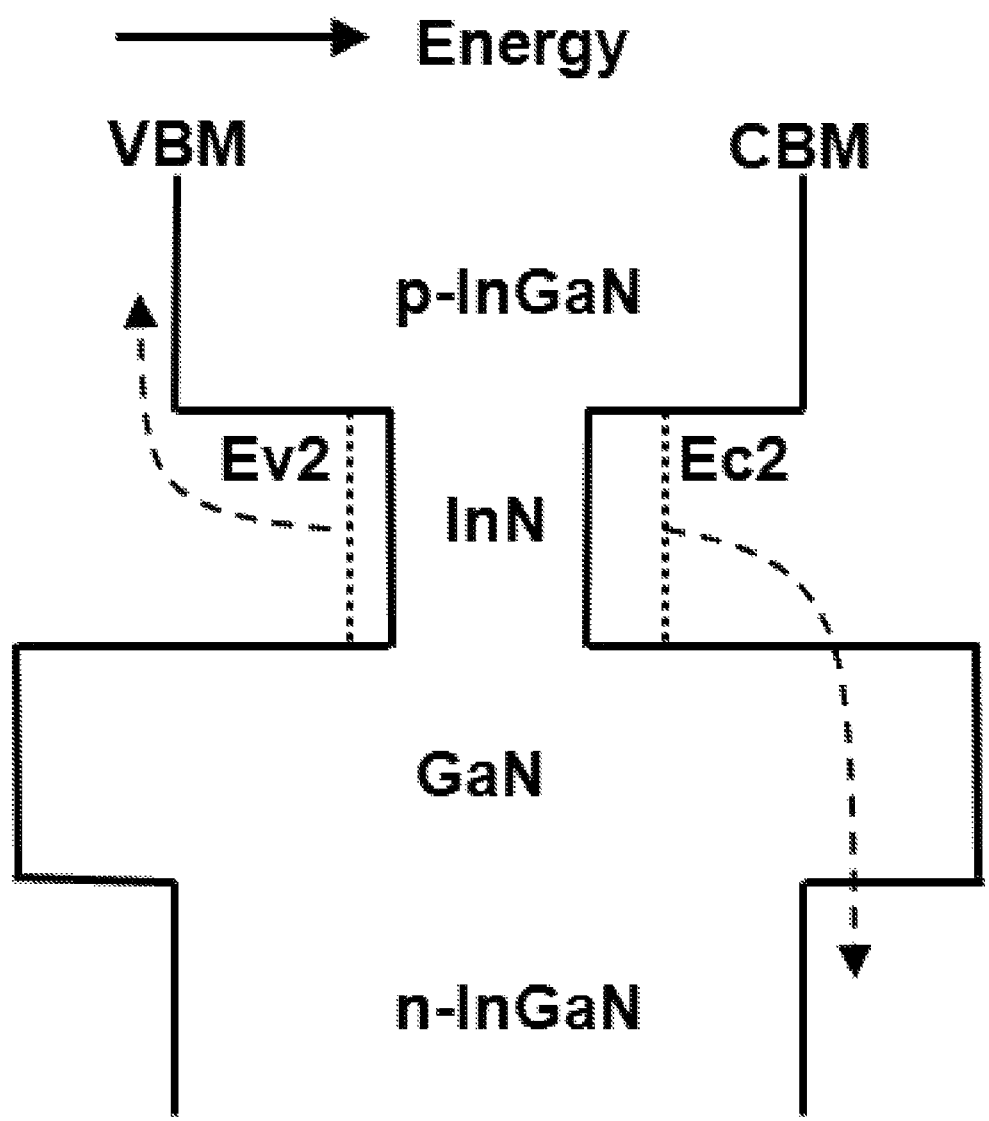
FIG. 5 is a conceptual drawing illustrating band lineups of GaN, InGaN and InN.

FIG. 5 is a conceptual drawing illustrating band lineups of GaN, InGaN and InN. In FIG. 5, the InN photosensitizing layer 23 and the GaN layer 25 are sandwiched by the n-InGaN layer 22 and p-InGaN layer 24. As in FIG. 4, CBM and VBM denote a conduction band bottom and a valence band top, respectively, and energy heightens in a direction from left to right in the arrangement in the figure. The effective bandgap energy of the InN photosensitizing layer 23 corresponds to a difference between the quantum levels Ec2 and Ev2 of electrons and holes.

In the present embodiment, carriers need to be made freely movable from the InN photosensitizing layer 23 to the n-InGaN layer 22 and the p-InGaN layer 24 by assistively applying a thermal excitation process at room temperature and an intraband transition process of absorbing light having bandgap energy lower than the 0.65 eV bandgap energy of InN, in order for the ultrathin InN film to provide a photosensitizing effect.

The bandgap energy differences (band offsets) between the InN photosensitizing layer 23 and the n-InGaN layer 22 and between the InN photosensitizing layer 23 and the p-InGaN layer 24 are about several 100 meV, thus being equal to or smaller than those in the first embodiment. That is, consideration from the viewpoint of the band offsets shows that carriers are freely movable from the InN photosensitizing layer 23 to the n-InGaN layer 22 and the p-InGaN layer 24. However, consideration from the viewpoint of electron transfer to the n-InGaN layer 22, in comparison with hole transfer from the InN photosensitizing layer 23 to the p-InGaN layer 24, shows that the GaN layer 25 can be a cause for disturbing the above-described electron transfer. In order to avoid this problem, i.e., to enable electrical connection between the InN photosensitizing layer 23 and the n-InGaN layer 22, the GaN layer 25, for example, is processed into an ultrathin film by reducing the layer thickness to the extent that electrons are capable of quantum-mechanical tunneling, specifically, to the order of nanometers. As the result above-described considerations, the inventors have found that the InN photosensitizing layer 23 can provide a photosensitizing effect. In addition, the InN photosensitizing layer 23 is substantially free from the problem of composition inhomogeneity, and the growth process is self-ordered and self-stopping. Consequently, absorption edge wavelengths are easily and precisely controlled with no dependence on the In compositions of the n-InGaN layer 22 and the p-InGaN layer 24.

From the discussions made above, it is understood that the unit cell 20 constituting a tandem solar cell according to the present embodiment can make not only light corresponding to the forbidden band width (bandgap energy) of InGaN forming a pn junction but also light corresponding to the effective bandgap energy of the InN photosensitizing layer 23 available for photoelectric conversion, without lowering a photoexcited voltage. Consequently, it is possible to obtain a unit cell of a tandem solar cell having high power due to the photosensitizing effect of longer-wavelength components.

Note that in the present embodiment, a description has been given of a configuration in which a pn junction is formed of InGaN. The present embodiment is not limited to this configuration only, however. For example, a configuration in which a pn junction is formed of $In_xGa_yAl_{1-x-y}N$ (ranges of x and y are defined as $0 \le x+y \le 1$) is also possible. According to this configuration, the forbidden band width of $In_xGa_yAl_{1-x-y}N$ can be optionally varied by varying the mixed crystal ratios x and y. Since the effective bandgap energy of an InN layer having a layer thickness equal to or less than a bimolecular layer thickness is also approximately several 100 meV lower than the bandgap energy of $In_xGa_yAl_{1-x-y}N$, the absorption edge wavelength of a solar cell is easily and precisely controlled, while providing a photosensitizing effect.

In addition, in the present embodiment, a description has been given of a configuration in which the InN photosensitizing layer 23 is formed of a single layer, as illustrated in FIGS. 4 and 5. Alternatively, a configuration is possible in which, for example, a plurality of InN photosensitizing layers 23 is inserted to form a multilayer structure. According to this configuration, the amount of light absorbed increases with an increase in the number of the plurality of inserted InN photosensitizing layers 23. Thus, it is possible to further enhance the photosensitizing effect. In this case, the multilayer structure may be composed of InN photosensitizing layers 23 running off from the depletion region of a pn-junction boundary face.

In addition, a configuration is possible in which the InN photosensitizing layer 23 is sandwiched or capped by undoped GaN (hereinafter referred to as i-InGaN) layers, whether the InN photosensitizing layer 23 is a monolayer or a multilayer. With this configuration, it is possible to suitably control the depletion region of the pn-junction boundary face.

[Method for Manufacturing Solar Cell of Second Embodiment]

Figure 6:
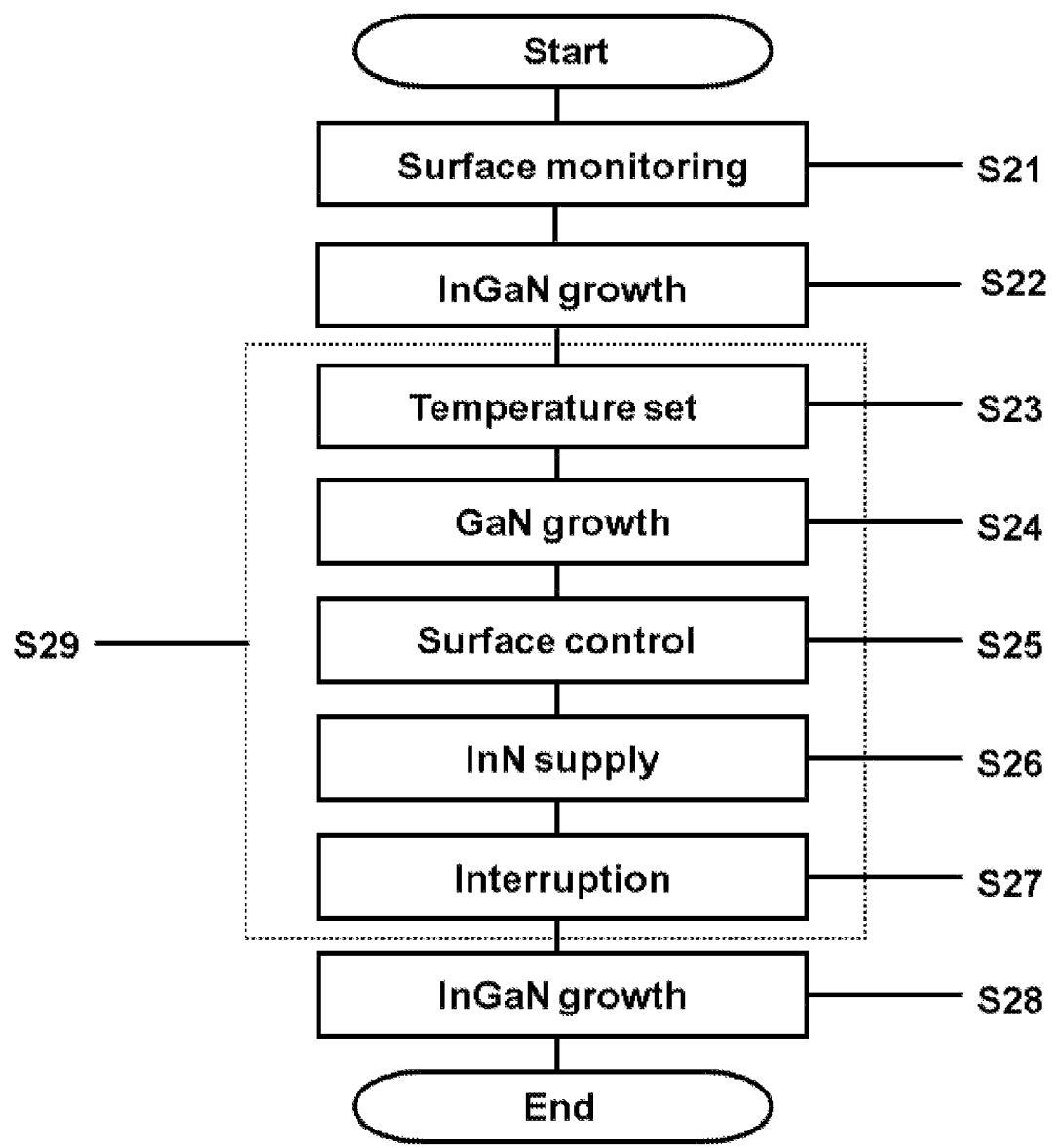
FIG. 6 is a flowchart illustrating a method for manufacturing the unit cell for constituting the tandem solar cell according to the second embodiment.

A method for manufacturing the unit cell 20 constituting the tandem solar cell of the second embodiment will be described with reference to FIG. 6. Note that a description will be given here by citing a molecular beam epitaxy (MBE) method as an example. Crystal growth techniques of the unit cell 20 are not limited to this method only, however, but other known semiconductor manufacturing techniques will also apply analogously. FIG. 6 is a flowchart illustrating the method for manufacturing the unit cell 20 according to the second embodiment. The figure illustrates, in particular, a growth method of the InN photosensitizing layer 23 and processes before and after the layer growth, which are the most important points of the present invention. Other unillustrated pre-processes, such as substrate treatment and foundation layer formation, and unillustrated post-processes, such as surface layer formation, electrode formation and microfabrication, are carried out using known semiconductor manufacturing techniques.

First, a surface condition observation of a sample having undergone the above-described pre-processes is initiated (step S21). This surface condition observation is conducted by means of, for example, reflected high energy electron diffraction (RHEED) or spectral ellipsometry (SE). In this way, the physical or chemical condition of the growth surface of the sample during the growth of each layer and before and after the layer growth is observed in real time. This is because the growth of an ultrathin InN film is based on a self-ordered and self-stopping process taking advantage of the immiscibility of InN, and therefore, control of surface-adsorbed atoms, i.e., stoichiometric surface control, for example, is required.

Next, InGaN growth is performed (step S22). This InGaN may be either the n-InGaN layer 22 or the p-InGaN layer 24 constituting the solar cell 20 of the present embodiment, or may be the above-described i-InGaN layer. Thereafter, a process of forming the InN photosensitizing layer 23 is carried out (step S29).

Step S29 comprises growth temperature setting (step S23), a GaN growth process (step S24), a growth surface control process (step S25), supply of raw materials of indium (In) and nitrogen (N) (step S26), and growth interruption (step S27). A layer grown in step S24 corresponds to the GaN layer 25.

In an MBE method, GaN growth shown in step S24 is generally performed under slightly gallium (Ga)-rich stoichiometric surface conditions. In order to ensure immiscibility between InN and GaN, however, it is not preferable that adsorbed Ga is present on a growth surface immediately before the growth of the ultrathin InN film. Hence, in step S25, only the raw material of N is supplied, without supplying the raw material of In, so that surface-adsorbed Ga is crystallized into GaN or dried up. In step S26, a raw material corresponding in amount to a layer thickness equal to or larger than a bimolecular layer thickness is excessively supplied, though the raw materials of In and N are supplied, in order to form an ultrathin InN film having a layer thickness equal to or less than a bimolecular layer thickness. The physical/chemical conditions of the growth surface in step S29 have been comprehended by the surface condition observation initiated in step S21.

The layer thickness control of the InN photosensitizing layer 23 takes advantage of a desorption process of excessively-supplied InN and is, therefore, performed using the growth temperature set in step S23 and a time of growth interruption introduced as step S27. Typically, InN growth is performed at a growth temperature of approximately 600° C. or lower if the InN growth is performed by a MBE method. However, the inventors have found that an ultrathin film of InN having a layer thickness equal to or less than a bimolecular layer thickness can be grown even at a temperature higher than or equal to this critical temperature of approximately 600° C. Specifically, a bimolecular InN layer is formed in a self-selective manner within the growth temperature range of 600° C. to 650° C. If the growth temperature is approximately 650° C., a monomolecular layer of InN is formed in a self-selective manner. If the growth temperature is raised further to within the range of approximately 650° C. to approximately 720° C., a fractional superlattice of InN having a layer thickness equal to or less than a monomolecular layer thickness is formed. This fractional superlattice of InN means that surface coverage 1 or less. For example, a 0.5 molecular layer corresponds to an island structure having a monomolecular layer thickness and a surface coverage of 50%, i.e., a quantum disc structure. In addition, in the above-described growth interruption, a time scale of approximately 0 to 1 minute is controlled in units of seconds. This is a time scale that can be fully controlled in a standard MBE apparatus.

After the process of forming the InN photosensitizing layer 23 shown in step S29, InGaN is grown (step S28). As with step S22, this InGaN may be either the n-InGaN layer 22 or the p-InGaN layer 24 composing the unit cell 20 constituting the tandem solar cell of the present embodiment, or may be the above-described i-InGaN layer.

If the InN photosensitizing layer 23 is formed into a multilayer structure, step S29 is repeated a desired number of times, following step S28.

By going through the above-described post-processes after the completion of step S28, there is obtained the unit cell 20 for constituting the tandem solar cell of the present embodiment.

The method for manufacturing the unit cell 20 constituting the tandem solar cell of the present embodiment has been described heretofore by citing the growth of InGaN as an example in steps S22 and S28. The method is not limited to this growth only, however. It is to be understood that the method also includes, for example, the growth of $In_xGa_yAl_{1-x-y}N$ (ranges of x and y are defined as $0 \leq x+y \leq 1$).

[Modified Example of Second Embodiment]

As a modified example of the second embodiment, a case in which a quantum well structure composed of an ultrathin InN film and an indium gallium nitride (InGaN) provides a photosensitizing effect will be described, while referring to FIGS. 7 to 9.

Figure 7:
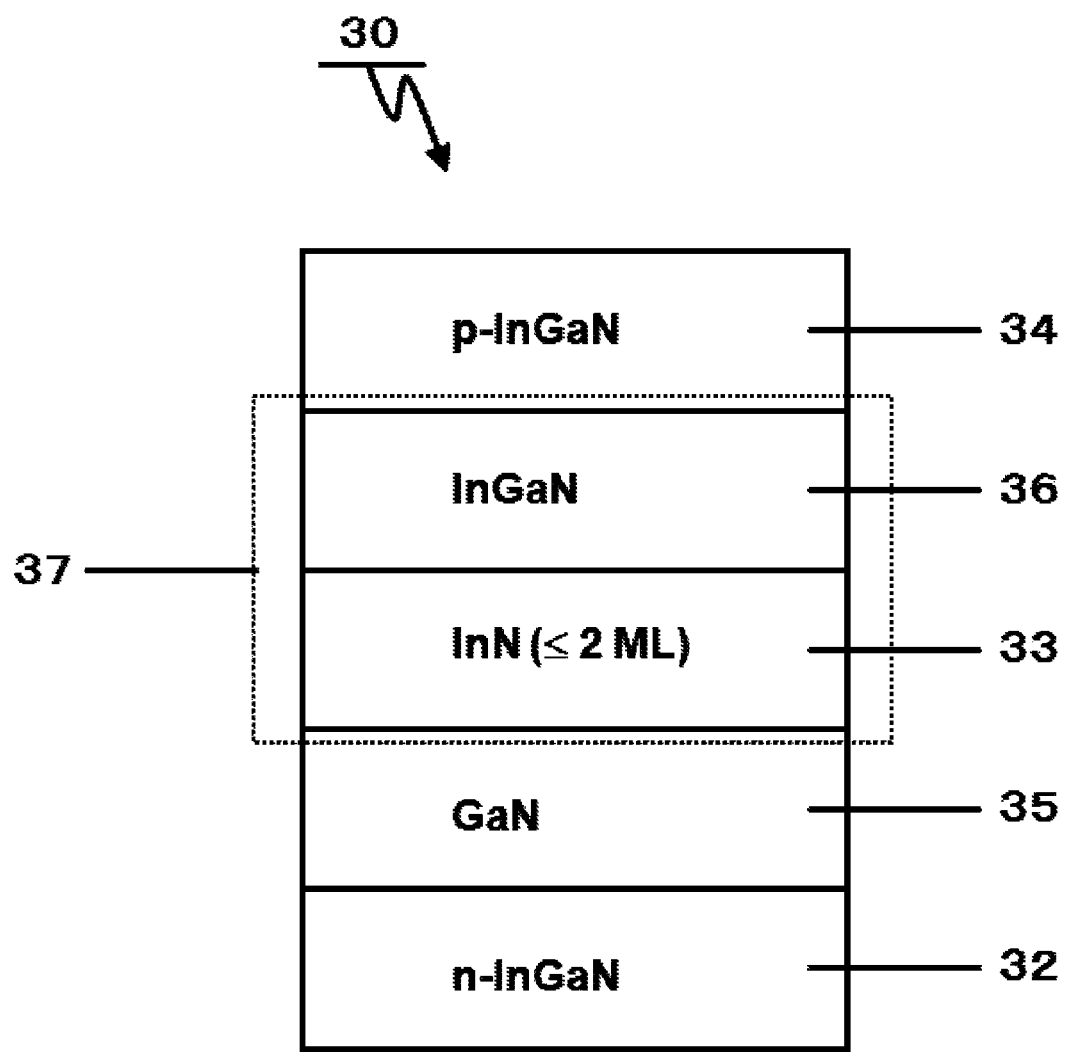
FIG. 7 is a block diagram illustrating a configuration example of a unit cell for constituting the tandem solar cell according to the second embodiment of the present invention.

FIG. 7 is a block diagram illustrating a configuration example of a unit cell 30 which is a modified example of the present embodiment. In FIG. 7, the unit cell 30 comprises: an n-type indium gallium nitride (n-InGaN) layer 32; a gallium nitride (GaN) layer 35 formed on the n-InGaN layer 32; an ultrathin-film indium nitride (InN) layer 33 formed on the GaN layer 35 having a layer thickness equal to or less than a bimolecular layer thickness; an indium gallium nitride (InGaN) layer 36 formed on the InN layer 33; and a p-type indium gallium nitride (p-InGaN) layer 34 formed on the InGaN layer 36. The ultrathin InN film layer 33 and the InGaN layer 36 constitute a photosensitizing layer 37 as a quantum well structure. The rest of configuration except the photosensitizing layer 37 is the same as the configuration illustrated in FIG. 4, and therefore, the description of the configuration will be omitted.

Figure 8:
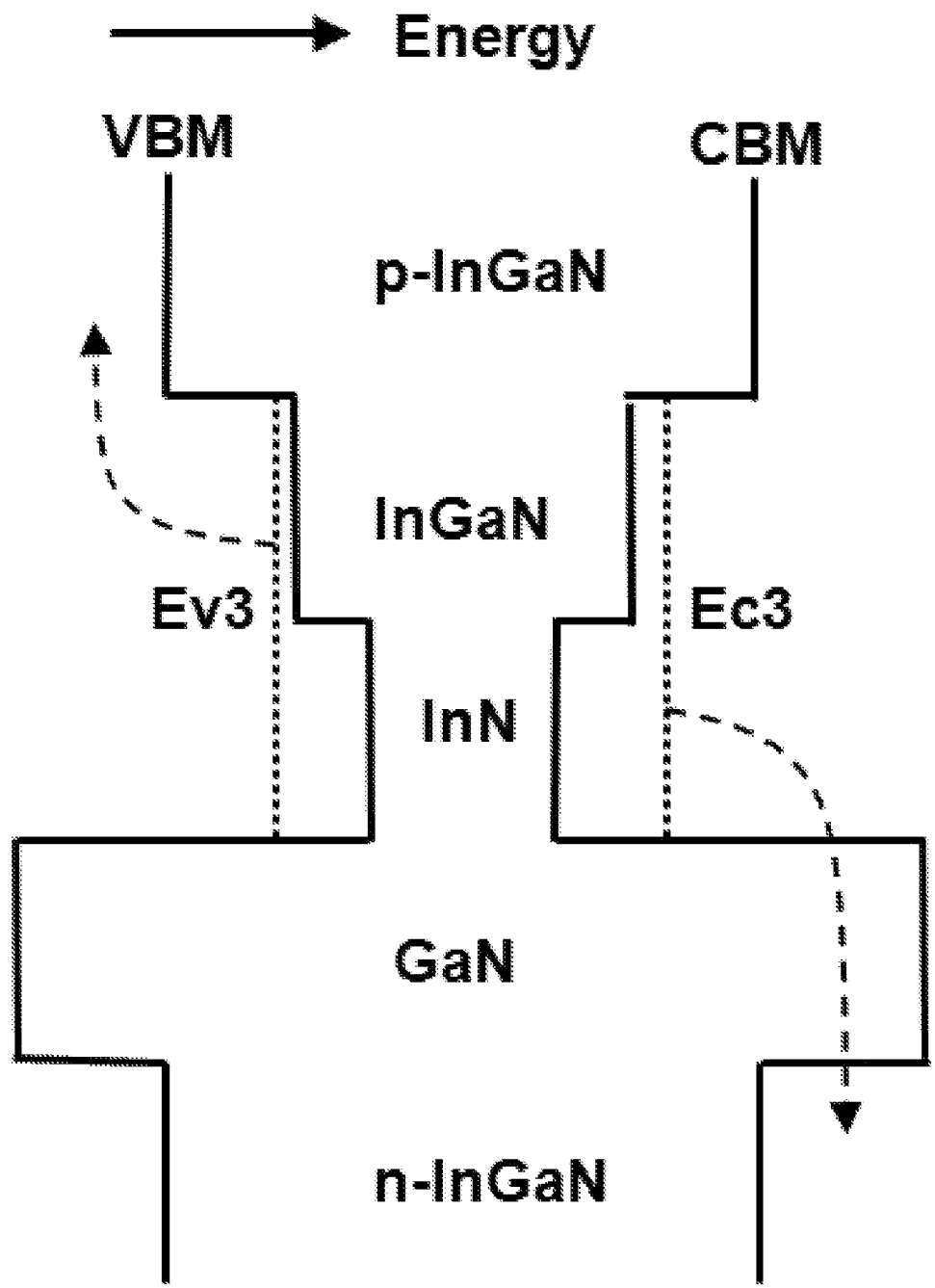
FIG. 8 is a conceptual drawing illustrating band lineups of GaN, InGaN and InN.

FIG. 8 is a conceptual drawing illustrating band lineups of GaN, InGaN and InN. FIG. 8 illustrates a situation in which the InN layer 33 and the InGaN layer 36 constitute the photosensitizing layer 37 as a quantum well structure. The rest of arrangement is the same as that in FIG. 5, and therefore, the description of the arrangement will be omitted. The effective bandgap energy of the photosensitizing layer 37 corresponds to a difference between the quantum levels Ec3 and Ev3 of electrons and holes.

The unit cell 30 of the present modified example is characterized by a configuration including the photosensitizing layer 37 based on a quantum well structure. Advantageous effects of this configuration will be described.

As a first effect, it is possible to increase the degree of freedom of designing the absorption edge wavelength of the unit cell 30. The quantum levels Ec3 and Ev3 of electrons and holes in a quantum well are controlled by the bandgap energy of the InGaN layer 36, i.e., the In mixed crystal ratio of the InGaN layer 36. Consequently, it is possible to improve the photosensitizing effect since carriers generated in the photosensitizing layer 37 are efficiently transferred to the n-InGaN layer 32 and the p-InGaN layer 34 by suitably adjusting the quantum levels Ec3 and Ev3.

As a second effect, it is possible to decrease the radiative carrier recombination probability in the photosensitizing layer 37 which is a quantum well. If the photosensitizing layer 37 is formed of an ultrathin InN film alone, the radiative carrier recombination probability may increase even in the presence of an internal electric field. In the case of a solar cell, however, radiative carrier recombination is a cause for loss in photoelectric conversion efficiency. In the photosensitizing layer 37 having a quantum well structure illustrated in FIG. 8, the photosensitizing effect can be enhanced since radiative carrier recombination probability is suppressed.

[Manufacturing Method According to Modified Example of Second Embodiment]

Subsequently, a method for manufacturing a unit cell 30 according to a modified example of the second embodiment will be described with reference to FIG. 9. Note that a description will be given here by citing a molecular beam epitaxy (MBE) method as an example. Crystal growth methods of the unit cell 30 are not limited to this method only, however, but other known semiconductor manufacturing techniques will also apply analogously. FIG. 9 is a flowchart illustrating the method for manufacturing the unit cell 30. Other unillustrated pre-processes, such as substrate treatment and foundation layer formation, and unillustrated post-processes, such as surface layer formation, electrode formation and microfabrication, are carried out using known semiconductor manufacturing techniques.

First, a surface condition observation of a sample having undergone the above-described pre-processes is initiated (step S31). Next, InGaN growth is performed (step S32). Thereafter, a process of forming the photosensitizing layer 37 is carried out (step S40). Step S40 comprises growth temperature setting (step S33), a GaN growth process (step S34), a growth surface control process (step S35), supply of raw materials of indium (In) and nitrogen (N) (step S36), growth interruption (step S37), and an InGaN growth process (step S38). After the process of forming the photosensitizing layer 37 shown in step S40, InGaN growth is performed (step S39).

If the photosensitizing layer 37 is formed into a multilayer structure, step S40 is repeated a desired number of times, following step S39.

By going through the above-described post-processes after the completion of step S28, there is obtained the solar cell 30 for constituting a tandem solar cell according to the present embodiment.

Figure 9:
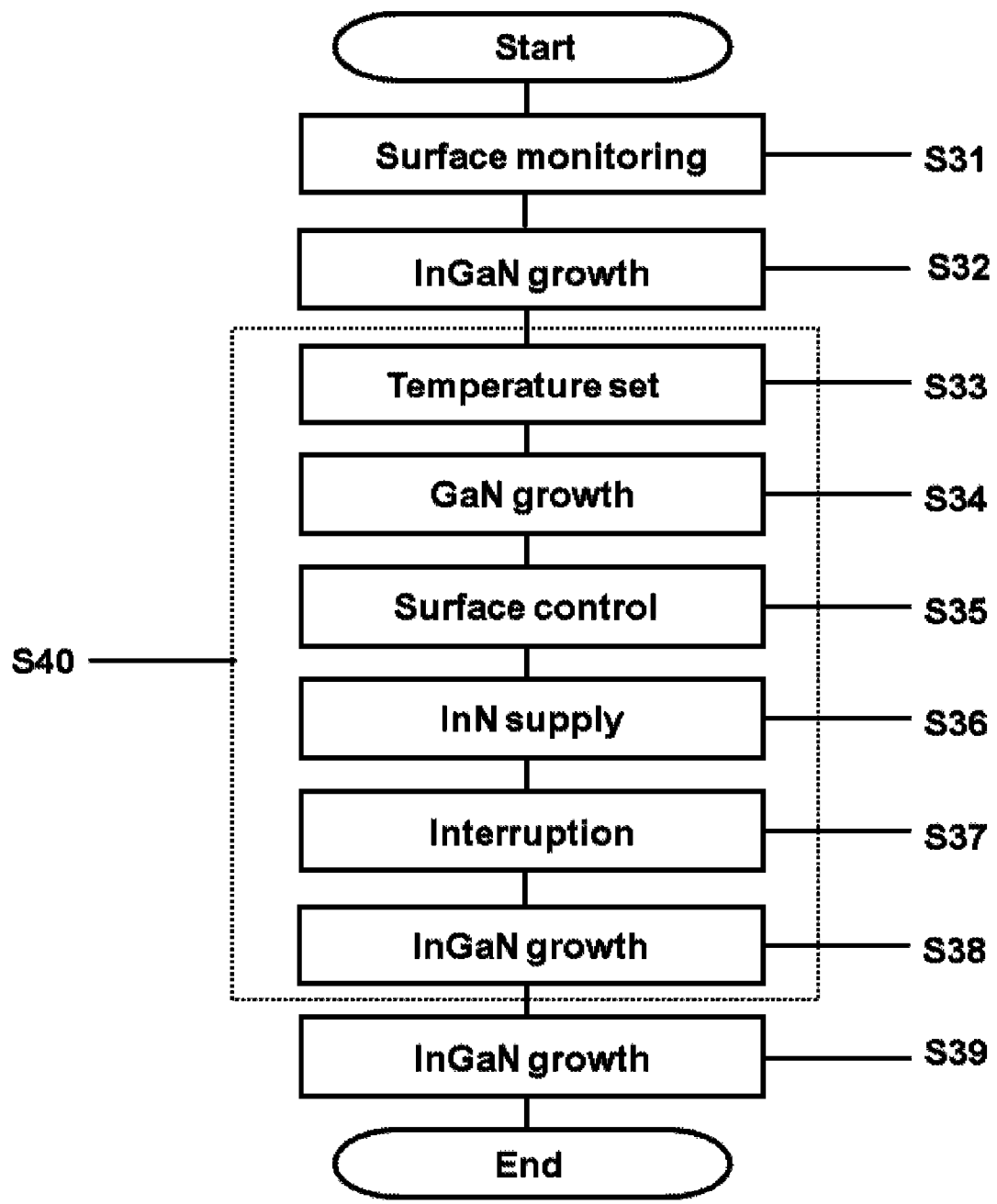
FIG. 9 is a flowchart illustrating a method for manufacturing the unit cell for constituting the tandem solar cell according to the second embodiment.

The method for manufacturing the unit cell 30 shown in FIG. 9 is the same as the method for manufacturing the unit cell 20 shown in FIG. 6, except that step S38 is added to the former. Accordingly, a detailed description of respective steps will be omitted.

Third Embodiment

In the first and second embodiments, a description has been given of the configuration of a solar cell (unit cell) having a photosensitizing effect. By replacing the pn junction of this solar cell (unit cell) with an $In_xGa_yAl_{1-x-y}N$-based pn junction which is a modified example of the pn junction, the forbidden band width of the cell can be adapted to the range of 6.2 eV to 0.65 eV, while allowing the ultrathin InN film to provide a sensitizing effect. Consequently, it is possible to configure each cell of a tandem solar cell matching with approximately 87.5% of a spectral domain of total solar light power. In the present embodiment, the tandem solar cell comprising the above-described unit cells will be described, while referring to FIG. 10.

Figure 10:
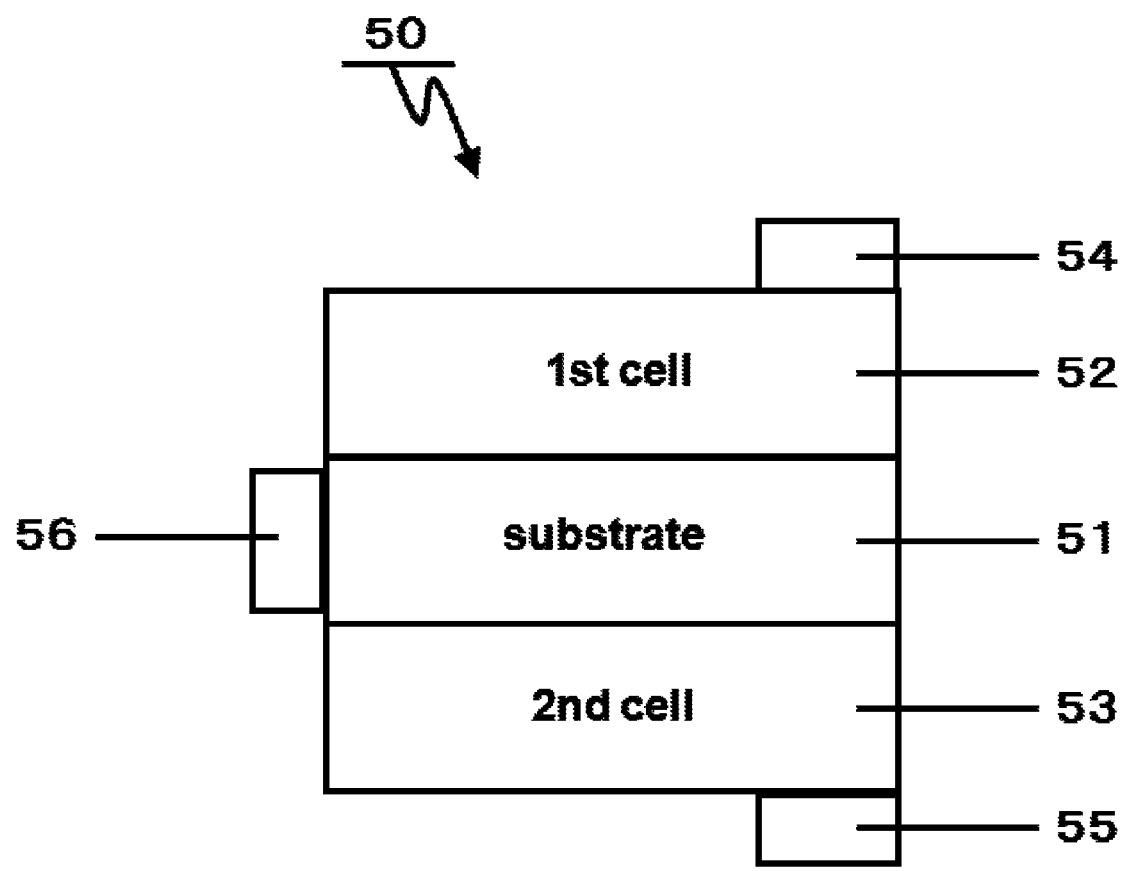
FIG. 10 is a block diagram illustrating a configuration example of the tandem solar cell according to the second embodiment.

FIG. 10 is a block diagram illustrating a configuration example of a tandem solar cell 50 according to the present embodiment. In FIG. 10, the tandem solar cell 50 comprises: a substrate 51; a first cell 52 formed on one surface of the substrate 51; a second cell 53 formed on the other surface of the substrate 51; an electrode 54 placed in contact with the first cell 52; an electrode 55 placed in contact with the second cell 53; and an electrode 56 placed in contact with the substrate 51.

The substrate 51 is required to not only serve as a mere growth substrate but also be capable of electrically and optically connecting the first cell 52 and the second cell to each other. The substrate 51 is composed of, for example, either a nitride semiconductor, such as an gallium nitride (GaN), an aluminum nitride (AlN) or an aluminum gallium nitride (AlGaN), a zinc oxide (ZnO), silicon (Si), or silicon carbide (SiC).

Either the first cell 52 or the second cell 53 is configured using the solar cell 10 or the unit cell 20 or 30 shown in the above-described first and second embodiments. In addition, the first cell 52 and the second cell 53 have different forbidden band widths and are configured along an entering direction of light from a light-receiving plane, in the order of widest to narrowest forbidden band widths.

In the present embodiment, a description has been given of a configuration in which the number of cells of a tandem structure is 2 only, as illustrated in FIG. 10. Alternatively, a configuration is possible in which the first cell 52 or the second cell 53, for example, comprises a plurality of unit cells to form a multilayer structure. In this case, the respective unit cells have different forbidden band widths and are stacked along an entering direction of light from a light-receiving plane, in the order of widest to narrowest forbidden band widths. According to this configuration, it is possible to obtain a high-power tandem solar cell since matching with a solar light spectrum improves with an increase in the number of cells.

In addition, since the first cell 52 and the second cell 53 are electrically connected in series to each other in a two-terminal configuration based on the electrodes 54 and 55, the tandem solar cell is required to satisfy the current conservation condition that the respective cells generate the same excited current. On the other hand, since the first cell 52 and the second cell 53 are partitioned by the electrode 56 in a three-terminal configuration based on the electrodes 54, 55 and 56, the cells can operate independently of each other.

As described above, if the first cell 52 or the second cell 53 comprises a plurality of unit cells, the plurality of unit cells connected in series within the first cell 52 or the second cell 53, i.e., cells between the electrodes 54 and 56 or cells between the electrodes 55 and 56, need to satisfy the above-described current conservation condition. However, since the first cell 52 and the second cell 53 are partitioned by the electrode 56 and operate independently of each other, the cells need not satisfy the current conservation condition. If, for example, a tandem-structured solar cell is a four-cell tandem structure, all of the four cells need not be connected in series. Instead, the first cell 52 may be composed of two cells and the second cell 53 may be composed of two cells, respectively. Consequently, it is possible to alleviate the current conservation condition that the cells constituting the tandem-structured solar cell generate the same excited current.

Figure 11:
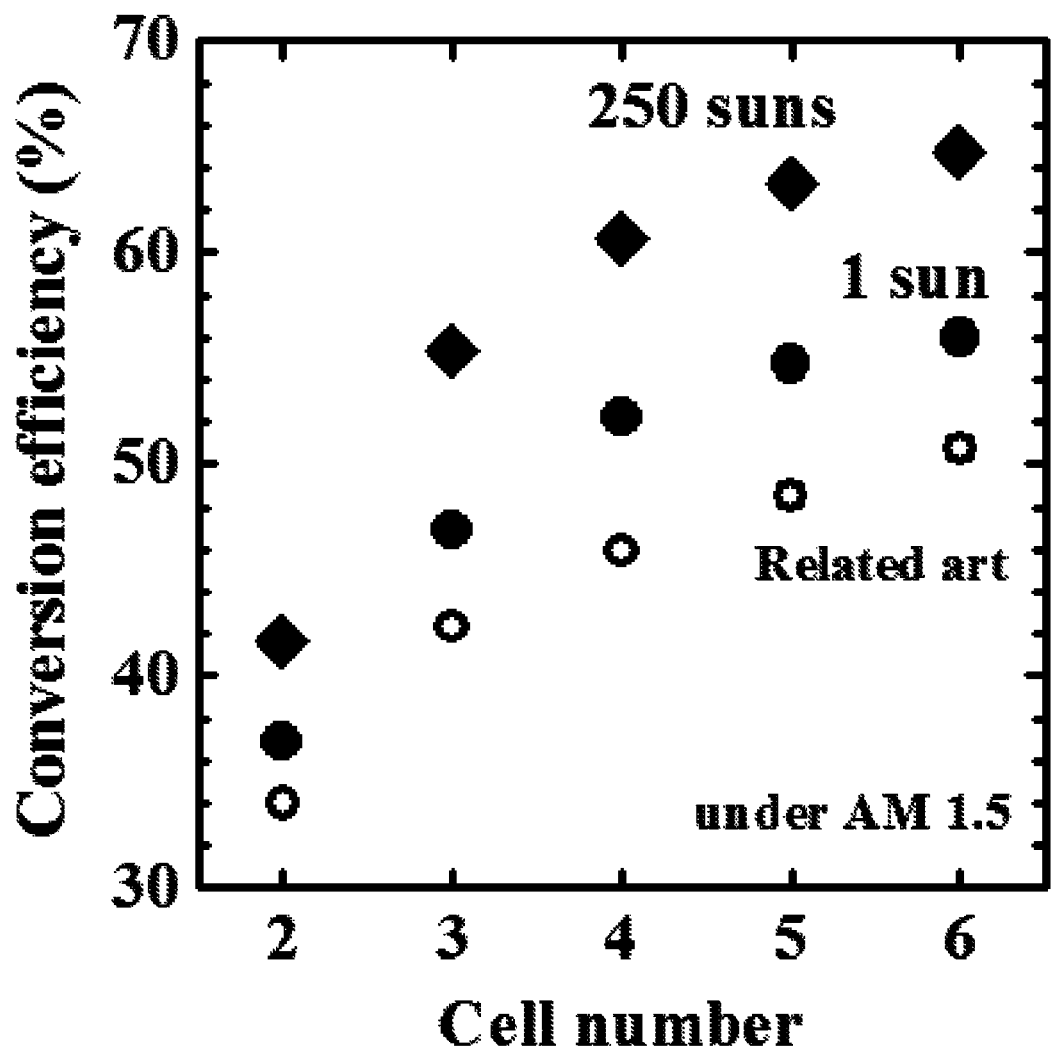
FIG. 11 is a graph showing the maximum theoretical conversion efficiency with respect to the number of cells in a tandem solar cell.
Figure 12:
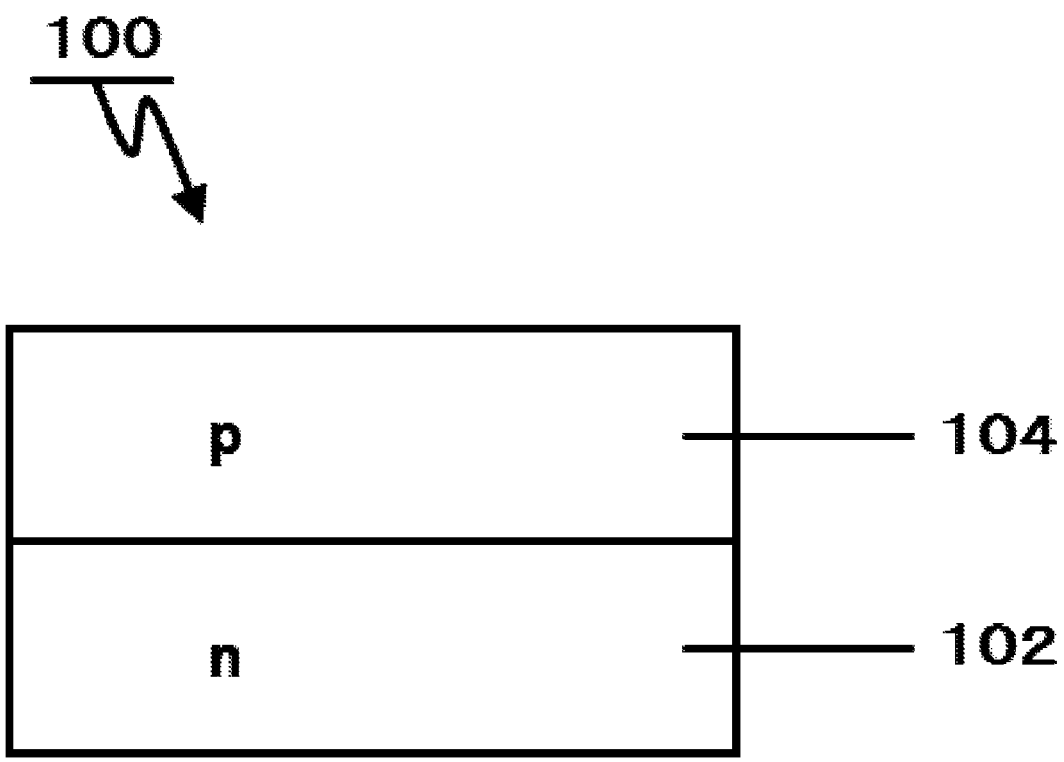
FIG. 12 is a block diagram illustrating the configuration of a solar cell according to a conventional example.

Next, the photoelectric conversion efficiency of the tandem solar cell 50 according to the present embodiment will be described, while referring to FIG. 11. FIG. 11 is a graph showing maximum theoretical conversion efficiency with respect to the number of cells in a tandem solar cell according to the present invention. Incident solar light is an AM1.5 spectrum, and therefore, the standard spectrum "ASTM G173-03 Reference Spectra Devised from SMARTS v.2.9.2" was used. In FIG. 11, a black circle (●) denotes the maximum theoretical conversion efficiency of a tandem solar cell according to the present invention. On the other hand, a white circle (○) denotes the maximum theoretical conversion efficiency of the tandem solar cell described in Patent Literature 1. The white-circled graph is shown as reference data, in order to clarify superiority of the present invention in contrast to the background art.

In a six-cell tandem solar cell, for example, the maximum theoretical conversion efficiency of the present invention is 56%, whereas the maximum theoretical conversion efficiency of the background art is 51%. Thus, the photoelectric conversion efficiency of the tandem solar cell according to the present invention surpasses the photoelectric conversion efficiency of the background art. This is because light having longer-wavelength components can be utilized, without lowering a photoexcited voltage, due to the photosensitizing effect of an InN ultrathin film. Consequently, outstanding superiority of the present invention that has not been predictable from the background art can be observed in the graph.

In addition, the usefulness of the above-described photosensitizing effect becomes prominent at the time of condensing solar light. In FIG. 11, the maximum theoretical conversion efficiency is plotted with a black rectangle (◆) when solar light is condensed at a 250 magnification in a tandem solar cell according to the present invention. It is understood that the maximum theoretical conversion efficiency greatly improves from 56% to 65% in, for example, a six-cell tandem solar cell, by condensing the light, and therefore, a high-power tandem solar cell can be obtained.

As has been described heretofore, according to the above-described embodiments, it is possible to provide a solar cell which facilitates precise control of the absorption edge wavelength of each cell in a tandem solar cell and has high photoelectric conversion efficiency, and a method for manufacturing the solar cell.

In addition, it is to be understood that the above-described embodiments are illustrative of only a few of the many possible specific embodiments which can represent applications of the principles of the invention. Numerous and varied other arrangements can be readily devised by those skilled in the art without departing from the spirit and scope of the invention, and modifications, substitutions, and omissions may be made therein without departing from the intension of the invention.

INDUSTRIAL APPLICABILITY

The photoelectric conversion device according to the present invention is available for a concentration solar cell for ground use, or a solar cell for mounting on an artificial satellite.

What is claimed is:

1. A solar cell comprising:
a first $In_xGa_yAl_{1-x-y}N$ layer having a first conductivity type and first bandgap energy lower than the bandgap energy of GaN;
a GaN layer formed on the first $In_xAl_{1-x-y}N$ layer;
a second $In_xGa_yAl_{1-x-y}N$ layer having a second conductivity type and second bandgap energy lower than the bandgap energy of GaN; and
an InN photosensitizing layer having a layer thickness less than or equal to a two monolayer thickness and formed coherently with at least one of the GaN layer and the second $In_xGa_yAl_{1-x-y}N$ layer, between the GaN layer and the second $In_xGa_yAl_{1-x-y}N$ layer,
wherein ranges of x and y are defined as $0 \leq x+y \leq 1$, the InN photosensitizing layer has third bandgap energy that is lower than at least one of the first bandgap energy and the second bandgap energy by an amount that enables photoexcited carriers in the InN photosensitizing layer to move to at least one of the first $In_xGa_yAl_{1-x-y}N$ layer and the second $In_xGa_yAl_{1-x-y}N$ layer by thermal excitation or by an intraband light absorption process, the amount is less than or equal to 500 meV for a part of $0 \leq x+y \leq 1$, the part including $x+y=1$, and the GaN layer has a film thickness which allows electrons to tunnel between the first $In_xGa_yAl_{1-x-y}N$ layer and the InN photosensitizing layer.

2. The solar cell according to claim 1, further comprising a fifth $In_xGa_yAl_{1-x-y}N$ layer formed between the second $In_xGa_yAl_{1-x-y}N$ layer and the InN photosensitizing layer,
wherein the fifth $In_xGa_yAl_{1-x-y}N$ layer has fifth bandgap energy, and the fifth bandgap energy is not higher than the second bandgap energy and not lower than the third bandgap energy of the InN photosensitizing layer.

3. The solar cell according to claim 1, constituting at least one of a first cell and a second cell included in a tandem solar cell.

4. The solar cell according to claim 3, wherein the tandem solar cell further includes a growth substrate, and comprises the first cell on one surface of the growth substrate and the second cell on the other surface of the growth substrate.

5. The solar cell according to claim 4, wherein the growth substrate is made of one of a nitride semiconductor, zinc oxide, silicon, and silicon carbide.

6. The solar cell according to claim 4, further comprising:
a first electrode electrically connected to the first cell;
a second electrode electrically connected to the second cell; and
a third electrode electrically connected to the growth substrate.

7. The solar cell according to claim 1, wherein the amount is less than or equal to 200 meV.

8. The solar cell according to claim 7, wherein the layer thickness of the InN photosensitizing layer is a one monolayer thickness.

9. A method for manufacturing a solar cell provided with a first $In_xGa_yAl_{1-x-y}N$ layer having a first conductivity type, a second $In_xGa_yAl_{1-x-y}N$ layer having a second conductivity type, and an InN photosensitizing layer formed between the first $In_xGa_yAl_{1-x-y}N$ layer and the second $In_xGa_yAl_{1-x-y}N$ layer,
wherein ranges of x and y are defined as $0 \leq x+y \leq 1$, the method comprising steps of:
forming the first $In_xGa_yAl_{1-x-y}N$ layer having the first conductivity type and first bandgap energy lower than the bandgap energy of GaN;
forming a GaN layer on the first $In_xAl_{1-x-y}N$ layer;
forming the second $In_xGa_yAl_{1-x-y}N$ layer having the second conductivity type and second bandgap energy lower than the bandgap energy of GaN; and
forming the InN photosensitizing layer coherently with at least one of the GaN layer and the second $In_xGa_yAl_{1-x-y}N$ layer, the InN photosensitizing layer having a layer thickness less than or equal to a two monolayer thickness and third bandgap energy that is lower than at least one of the first bandgap energy and the second bandgap energy by an amount that enables photoexcited carriers in the InN photosensitizing layer to move to at least one of the first $In_xGa_yAl_{1-x-y}N$ layer and the second $In_xGa_yAl_{1-x-y}N$ layer by thermal excitation or by an intraband light absorption process,
wherein the amount is less than or equal to 500 meV for a part of $0 \leq x+y \leq 1$, the part including $x+y=1$, and the GaN layer has a film thickness which allows electrons to tunnel between the first $In_xGa_yAl_{1-x-y}N$ layer and the InN photosensitizing layer.

10. The method for manufacturing a solar cell according to claim 9, wherein the step of forming the InN photosensitizing layer includes a step of supplying InN whose amount is greater than or equal to a two monolayer equivalent amount thereof.

11. The method for manufacturing a solar cell according to claim 9, wherein the step of forming the InN photosensitizing layer includes a step of not supplying an In material source.

12. The method for manufacturing a solar cell according to claim 9, wherein the step of forming the InN photosensitizing layer includes growth interruption.

13. The method for manufacturing a solar cell according to claim 9, wherein in the step of forming the InN photosensitizing layer, growth temperature is higher than or equal to 600° C.

14. The method for manufacturing a solar cell according to claim 13, wherein the growth temperature is 650° C. or higher but not higher than 720° C.

15. The method for manufacturing a solar cell according to claim 9, the method including a step of observing the physical or chemical condition of a growth surface.

* * * * *